United States Patent [19]

Nagayama et al.

[11] Patent Number: 5,742,129
[45] Date of Patent: Apr. 21, 1998

[54] ORGANIC ELECTROLUMINESCENT DISPLAY PANEL WITH PROJECTING RAMPARTS AND METHOD FOR MANUFACTURING THE SAME

[75] Inventors: Kenichi Nagayama; Satoshi Miyaguchi, both of Tsurugashima, Japan

[73] Assignee: Pioneer Electronic Corporation, Tokyo, Japan

[21] Appl. No.: 602,341

[22] Filed: Feb. 16, 1996

[30] Foreign Application Priority Data

Feb. 21, 1995 [JP] Japan ................................ 7-032043

[51] Int. Cl.$^6$ .................................................... H05B 33/02
[52] U.S. Cl. .................. 315/167; 315/169.3; 313/498
[58] Field of Search .......................... 315/169.3, 169.4, 315/169.1, 168, 167, 169.2; 313/498, 500, 505, 503, 504, 506, 509

[56] References Cited

U.S. PATENT DOCUMENTS

| | | | |
|---|---|---|---|
| 4,006,383 | 2/1977 | Luo et al. | 315/169.3 |
| 5,216,331 | 6/1993 | Hosokawa et al. | 315/169.3 |
| 5,276,381 | 1/1994 | Wakimoto et al. | 313/504 |

Primary Examiner—Robert Pascal
Assistant Examiner—David Vu
Attorney, Agent, or Firm—Sughrue, Mion, Zinn, Macpeak & Seas, PLLC

[57] ABSTRACT

A method for manufacturing an organic EL display panel having a plurality of emitting portions surrounded by ramparts and arranged as a matrix. The method includes the steps of forming a plurality of first display electrodes corresponding to emitting portions on a substrate; forming, on the substrate around the first display electrodes, electrical insulation ramparts surrounding the first display electrodes respectively; putting a shadow mask onto top surfaces of the ramparts, the shadow mask having a plurality of openings each exposing the first display electrode in the rampart, and aligning the openings to the first display electrodes respectively; depositing organic electroluminescent media through the openings onto the first display electrodes in the ramparts respectively, thereby forming organic function layers each including at least one organic electroluminescent medium on the first display electrodes in the ramparts; and forming a second display electrode formed all over or in stripe on the ramparts and the organic function layers. In the method, the mask putting and aligning step and the media depositing step are repeated in such a manner of that the shadow mask is shifted to an adjacent portion, whereby the openings are aligned to adjacent other first display electrodes, thereby enabling a highly efficient manufacturing method.

15 Claims, 10 Drawing Sheets

ORGANIC ELECTROLUMINESCENT DISPLAY PANEL WITH PROJECTING RAMPARTS AND METHOD FOR MANUFACTURING THE SAME

BACKGROUND OF THE INVENTION

1. Field of the Invention

The present invention relates to an organic electroluminescent display panel (also referred to herein as an organic EL display panel) used in a display apparatus and comprising a plurality of organic EL elements each including an emitting layer made of an organic compound material, which utilizes an electroluminescence phenomenon, that is the emission of light resulting from injection of an electric current to the emitting layer. More particularly, it is concerned with a full color display device comprising a matrix of the EL elements.

2. Description of the Related Art

As full color display devices, there have been known emitting devices as shown in Japanese Patent Kokai Nos. 5-275172, 5-258859 and 5-258860 corresponding to U.S. patent applications Ser. Nos. 814512, 814163 and 814553 respectively. Each of these full color display devices comprises a plurality of emitting pixels existing at intersections of lines and rows of matrix electrodes.

In the emitting device, the pixels are formed on a common transparent substrate with electrical insulation. The line electrodes made of transparent material are formed on the substrate and spaced from one another. This first transparent electrodes connect the adjacent pixels. Organic EL media are formed on the first electrodes and the substrate. The pixels include the second electrodes for the rows formed on the organic EL media respectively and spaced from one another. The second electrodes for the rows extend perpendicular to the first electrodes and connect the adjacent pixels respectively. The pixels on the line electrodes are partitioned by walls each extending parallel to the second electrodes of row. Those walls are previously formed on the substrate orthogonally thereto so as to be much higher than the stack of the organic EL media. In the emitting device, there is employed a simple matrix structure that the first and second electrodes sandwich the organic EL media at the intersections thereof.

In addition, such an emitting device is manufactured in a way that the second electrodes and the thin films of the organic EL media are vacuum-deposited by using such higher walls as masks formed on the substrate in such a manner that a predetermined vapor flow is provided in only one slanting direction to the substrate and partially and selectively shielded by the higher wall masks.

However, it is difficult to form such higher wall masks on the substrate when fine pixels and patterns for the display panel are manufactured, i.e., it is very difficult to form the higher wall mask having a high aspect ratio (height/bottom) in its cross-section. Even if such higher wall masks are formed on the substrate, the strength of the wall will be low and the reliability in the performances and shapes of the resulting second electrodes and organic EL media films will be low. In addition, such a manufacture of the emitting device invites a complicated processing because of the slanting vapor flow deposition in one direction with a low precision.

SUMMARY OF THE INVENTION

Thus, the present invention has been made to solve such a problem in view of the forgoing status. An object of the invention is to provide an organic electroluminescent display panel and method for manufacturing the same that are capable of being manufactured by simple processings.

In accordance with a first aspect of the present invention, an organic EL display panel having a plurality of emitting portions arranged as a matrix comprises;

a substrate on which a plurality of first display electrodes corresponding to emitting portions are formed;

electrical insulation ramparts formed on the substrate for surrounding the first display electrodes respectively;

organic function layers each including at least one organic electroluminescent medium formed on the first display electrodes in the ramparts; and a second display electrode formed all over or in stripe on the ramparts and the organic function layers.

The organic EL display panel further may comprise common scan signal lines and common data signal lines that are formed on the substrate in a coplanar surface thereof and arranged perpendicular to one another; and nonlinear elements each connected to the scan signal line, the data signal line and the first display electrode.

In the organic EL display panel, the nonlinear elements may comprise a thin film transistor and a capacitor connected to each other.

In the organic EL display panel, the substrate and the first display electrodes are transparent and the second display electrode has a metallic surface or a reflection film.

In a further embodiment of the organic EL display panel, when the second display electrode is transparent, each of the first display electrodes has a metallic surface or a reflection film formed on an outer side surface of the first display electrodes.

In accordance with a second aspect of the present invention, a method for manufacturing an organic EL display panel having a plurality of emitting portions arranged as a matrix comprises the steps of;

forming a plurality of first display electrodes corresponding to emitting portions on a substrate;

forming, on the substrate around the first display electrodes, electrical insulation ramparts surrounding the first display electrodes respectively;

putting a shadow mask onto top surfaces of the ramparts, the shadow mask having a plurality of openings each exposing the first display electrode in the rampart, and aligning the openings to the first display electrodes respectively;

depositing organic electroluminescent media through the openings onto the first display electrodes in the ramparts respectively, thereby forming organic function layers each including at least one organic electroluminescent medium on the first display electrodes in the ramparts; and forming a second display electrode formed all over or in stripe on the ramparts and the organic function layers.

In the above method for manufacturing the organic EL display panel, the mask putting and aligning step and the media depositing step are repeated in such a manner that the shadow mask is shifted to an adjacent portion where the openings aligned to adjacent other first display electrodes, whereby enabling a high efficient manufacturing.

In this way, since the rampart protects the organic function layer, there is a decrease of damage of the organic function layer due to the shadow mask put thereon. In addition, the use of the rampart and the shadow mask makes a sure separation of RGB organic function layers and shares the coatings of RGB organic media at a high precision.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings which are incorporated in and constitute a part of this invention, together with the description, serve to explain the principles of the invention in general terms. Like numerals refer to like parts throughout the disclosure.

The above and other features of the invention are made more apparent in the ensuing Detailed Description of the Invention when read in conjunction with the attached Drawings.

DETAILED DESCRIPTION OF THE PREFERRED EMBODIMENTS

The embodiments according to the present invention will be described in more detail with reference to the accompanying drawings.

Figure 1:
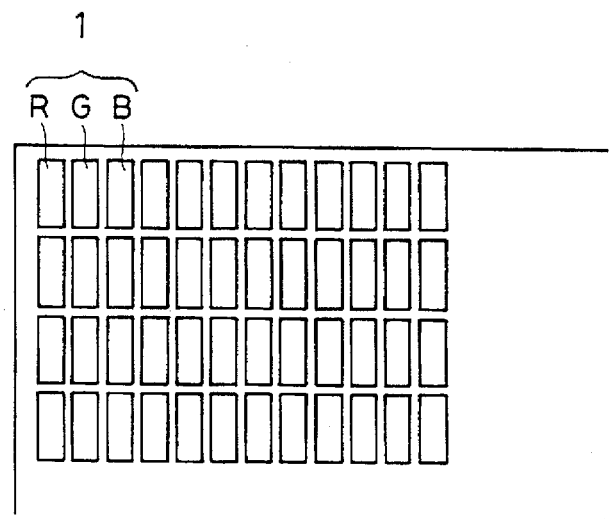
FIG. 1 is a partially enlarged simplified plan view of an organic EL display panel according to the present invention.

FIG. 1 shows a partially enlarged simplified plan view of an organic EL display panel of an embodiment which is provided with a plurality of emitting pixels 1 of matrix each having emitting portions for red (R), green (G) and blue (B) lights in order to display an image. This is seen through the substrate of the panel from the outside thereof.

Figure 2:
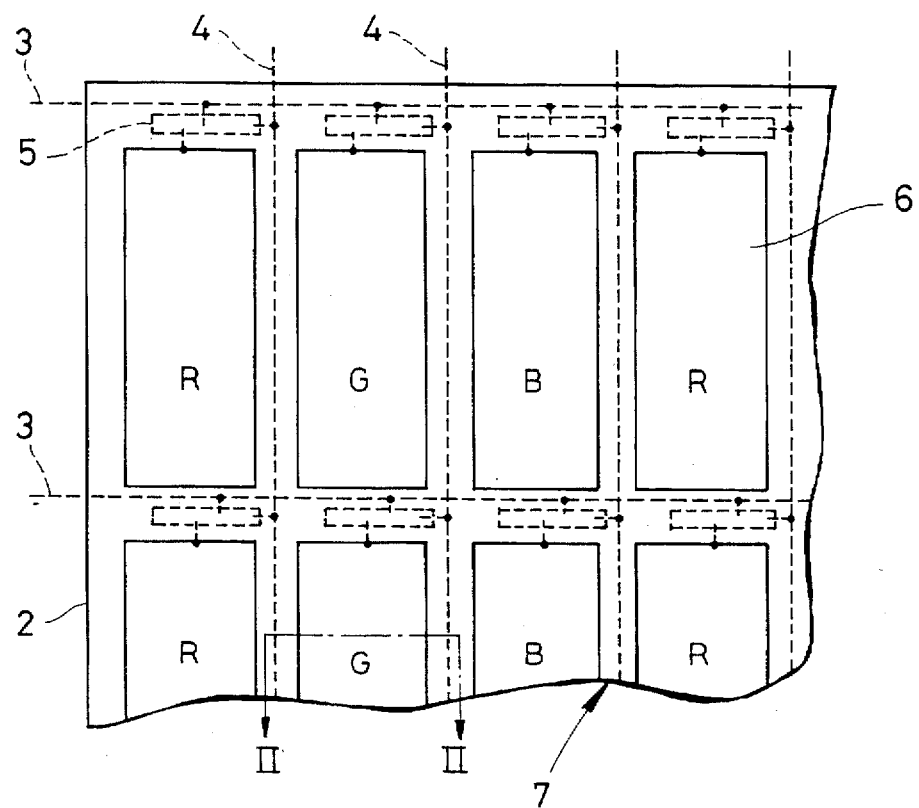
FIG. 2 is a further partially enlarged, simplified plan view of an organic EL display panel according to the present invention.

FIG. 2 shows a further enlarged view of FIG. 1 in which the substrate 2 carries a plurality of first display electrodes 6 corresponding to emitting portions R, G and B. The substrate 2 of the organic EL display panel also carries common scan signal lines 3 and common data signal lines 4 arranged perpendicular to one another in a coplanar surface thereof. The substrate 2 also carries nonlinear elements 5 each electrically connected to the scan signal line 3, the data signal line 4 and the first display electrode 6 for driving the pixel in response to electric signals provided from the signal lines.

Figure 3:
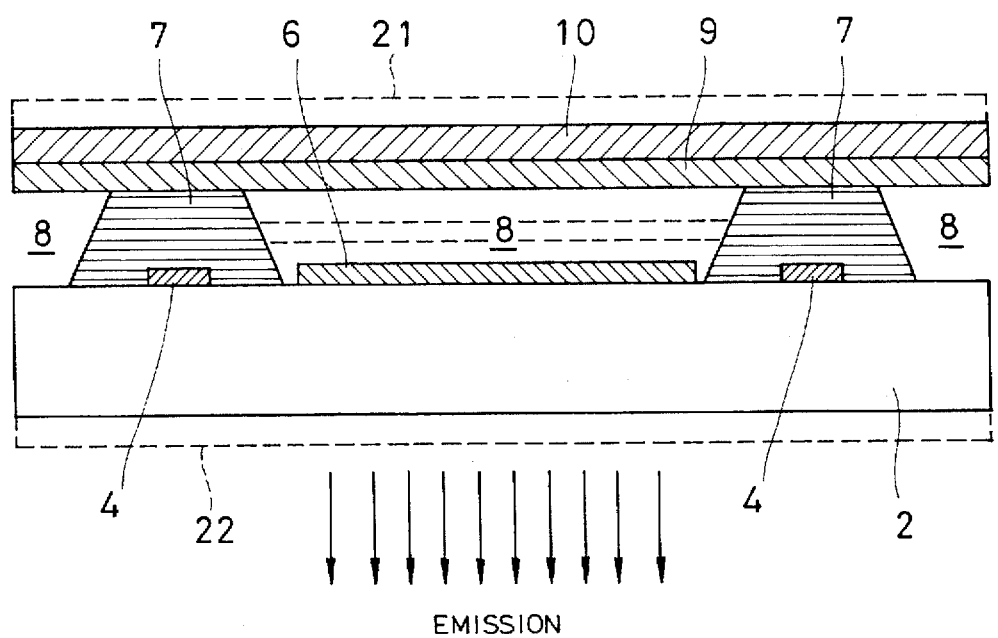
FIG. 3 is a cross-section simplified view of a portion taken in along line II—II of FIG. 2.

Moreover, the substrate 2 carries ramparts 7 made of an electrical insulation material for surrounding the first display electrodes 6 respectively as shown in FIGS. 2 and 3, each electrical insulation rampart 7 projecting from the substrate 2.

In each recess formed by the rampart 7, an organic function layer 8 including at least one organic electroluminescent medium or compound is formed on the first display electrode 6. The organic function layer 8 includes three organic EL media thin films e.g., an organic hole transport layer, an organic emitting layer and an organic electron transport layer as a three-layer structure. The organic function layer 8 may alternatively include a two-layer structure comprising an organic hole transport layer and an organic emitting layer.

As shown in FIG. 3, a second display electrode 9 is formed entirely on the ramparts 7 and the organic function layers 8 of the organic electroluminescent medium. The organic function layers 8 are electrically connected by the second display electrode 9. On the second display electrode 9, a protective film 10 or a protective substrate is formed preferably.

In this organic EL display panel, the substrate and the first display electrodes are light transmissible, and thus the light emission radiates from the substrate. Therefore, as shown in FIG. 3, a reflecting layer 21 may be preferably formed on the protective film 10 in order to improve the emitting efficiency. In contrast, the second display electrode may be made of a transparent material so as to emit light from the second display electrode in another embodiment of an organic EL display panel. In this case, another reflecting layer 22 may be preferably formed on the substrate 2 in order to improve the emitting efficiency.

Figure 4:
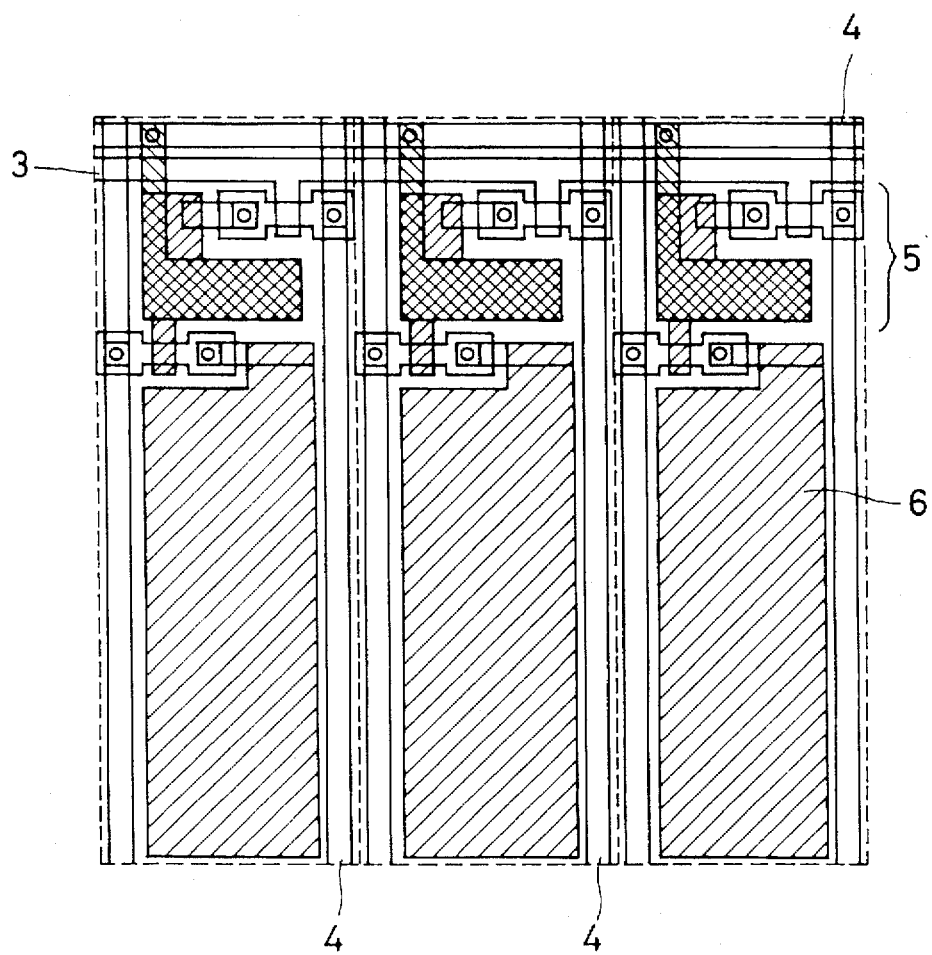
FIG. 4 is a partially enlarged plan view of a substrate carrying nonlinear elements of an organic EL display panel of an embodiment according to the present invention.
Figure 5:
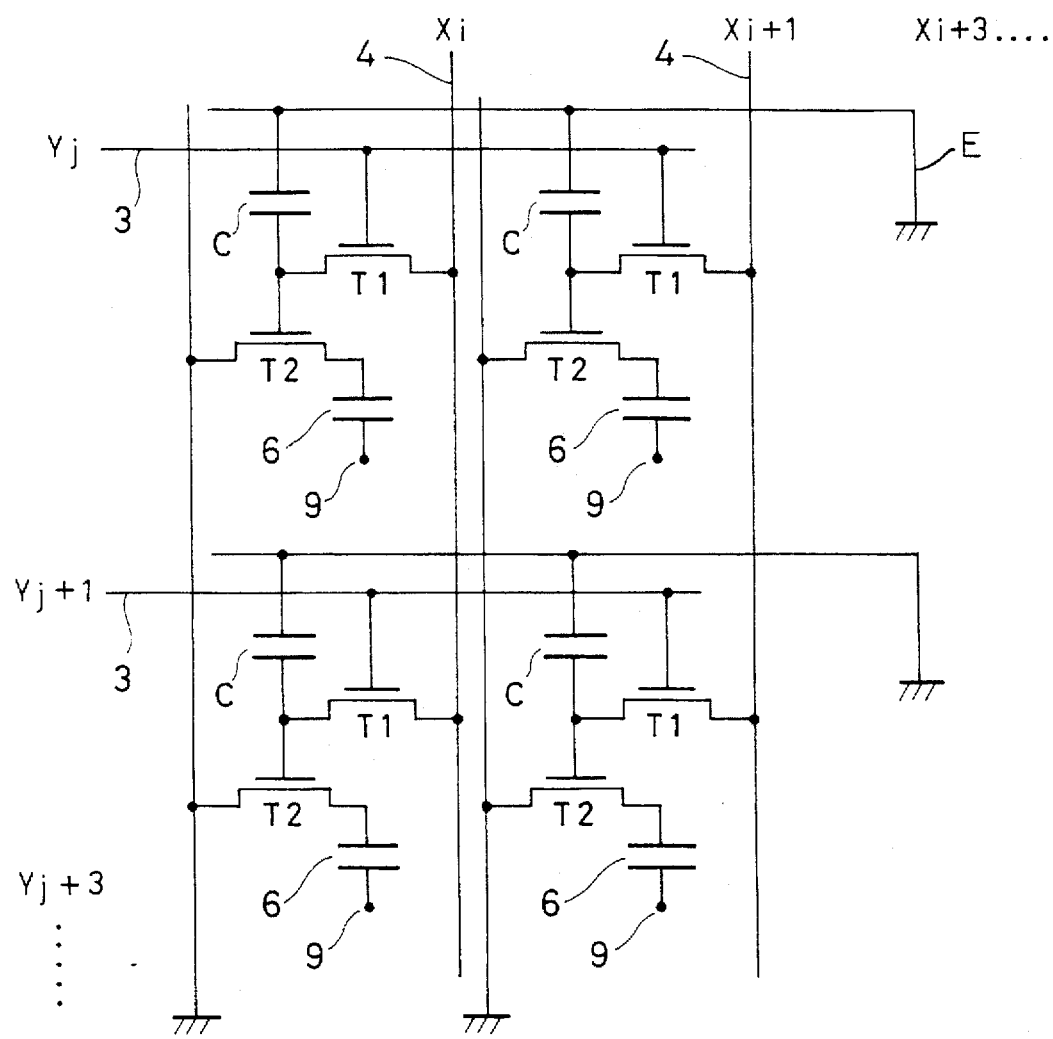
FIG. 5 is a circuit diagram showing nonlinear elements formed on the substrate of the organic EL display panel shown in FIG. 4.

In a concrete embodiment, e.g., an active-matrix type organic EL display panel, as shown in FIG. 4, a plurality of island shaped first display electrodes 6 made of indium tin oxide (referred to herein as ITO) are formed on a transparent substrate 2 of glass by using photolithography and the vacuum-deposition technology. Similarly, nonlinear elements 5 to be connected to the first display electrodes are also formed on the transparent substrate 2 as an active-matrix circuit. This nonlinear element 5 comprises thin film transistors (TFT) T1, T2 and a capacitor C. Furthermore, the data signal lines of common drain lines 4 and the scan signal lines of common gate lines 3 are formed on the substrate perpendicular to each other together with ground lines. As shown in FIG. 5, the source electrode of the first TFT (T1) is connected to the capacitor C and the gate of the second TFT (T2). The source electrode is connected via the capacitor C to the ground line E. The drain line of T2 is connected to the first display electrode 6, which is connected to the second display electrode 9. In this way, the emitting portion comprises the first display electrode 6 connected to the second display electrode 9 and the nonlinear element including the thin film transistors and the capacitor connected to each other as a one unit. The one pixel is constructed by three or more such units of emitting portions of different colors. Such pixels are arranged as a matrix correspondingly to the necessary numbers of pixels for a display panel, so that a full color organic EL display panel is obtained.

In addition to this embodiment having the nonlinear element of a three-terminal type including the thin film transistors and the capacitor, there may be employed p-Si, a-Si, CdSe, Te for materials of the thin film transistors. A circuit comprising MOS-FETs is usable for the nonlinear element. Instead of the three-terminal type, a two-terminal type TFT may be employed, for example MIM.

Figure 6:
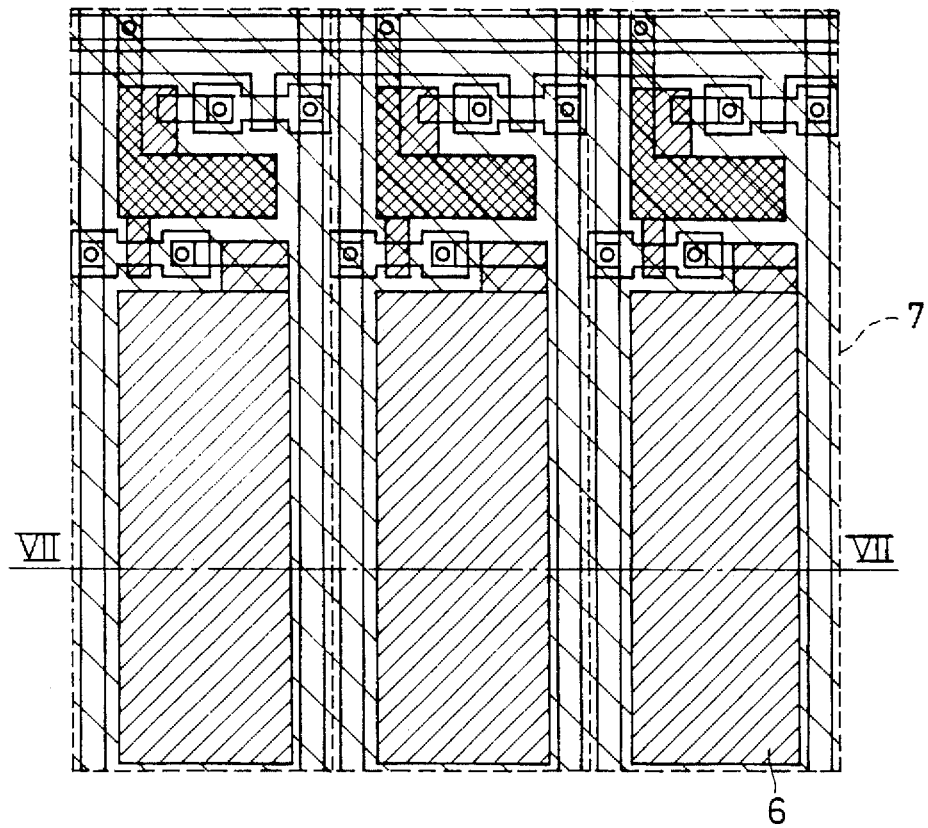
FIG. 6 is a partially enlarged plan view of the substrate carrying nonlinear elements and ramparts surrounding them of an organic EL display panel of the embodiment.
Figure 7:
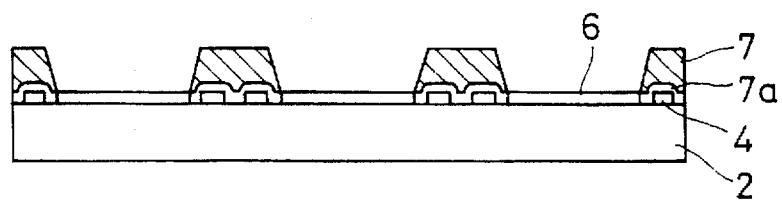
FIG. 7 is a cross-section view of a portion taken along line VII—VII of FIGS. 6 and 9.
Figure 8:
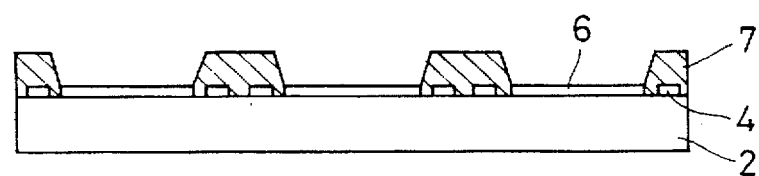
FIG. 8 is a partially enlarged cross-sectional view of the substrate carrying nonlinear elements and ramparts surrounding them of another embodiment of the organic EL display panel according to the present invention.

As shown in FIG. 6 and FIG. 7, the active-matrix circuit formed on the substrate 2 is protected by a thin film in the photolithography. A primary protective layer 7a of $Si_3N_4$ is selectively vacuum-deposited on the nonlinear elements 5 and the data signal lines of common drain lines 4 and the scan signal lines of common gate lines 3. Then the rampart 7 of a photoresist or photosensitive polyimides is selectively formed on the primary protective layer 7a up to a predetermined height by using the photolithography in which the photoresist is exposed with a pertinent pattern and then developed. Alternatively, the rampart 7 may be directly, selectively formed on the nonlinear elements 5 and the data signal lines of common drain lines 4 and the scan signal lines of common gate lines 3 without any primary protective layer as shown in FIG. 8.

A method to drive the active-matrix circuit is now described briefly referring to FIG. 5. Upon application of a pulse voltage to one selected intersection of the drain lines Xi, Xi+1, Xi+2, . . . and the gate lines Yj, Yj+1, Yj+2, . . . , T1 is turned to ON status to charge the capacitor. This charged voltage is determined by the pulse duration applied to the gate. When the charged voltage is sufficiently large to make the gate voltage of T2 have the ON status, a previously set voltage is applied to the organic function layer 8 since the voltage is previously applied via the organic function layer 8 to the transparent electrodes. The discharge of the capacitor progresses and the gate voltage decreases gradually. For this the conduction period of T2 is defined by the charged voltage of the capacitor. The luminance of the emitting portion also concerns this conduction period. The light emission of the intersection pixel is selectively performed by the sequential scanning of the X and Y electrode lines in response to RGB signals applied to the drain lines.

A process for manufacturing the organic EL display panel is now described.

First, gate lines, gate insulation films, channel layers, contact layers, transparent first display electrodes (ITO anode), source lines, drain lines, signal lines and the like, and a predetermined TFT array are formed on a glass substrate as described above. After that, by using the photolithography including the exposure and development, the insulation ramparts 7 of a photoresist or photosensitive polyimide are selectively formed up to a predetermined height on functional elements such as TFT array, the lines and the above, except the ITO anode.

Figure 9:
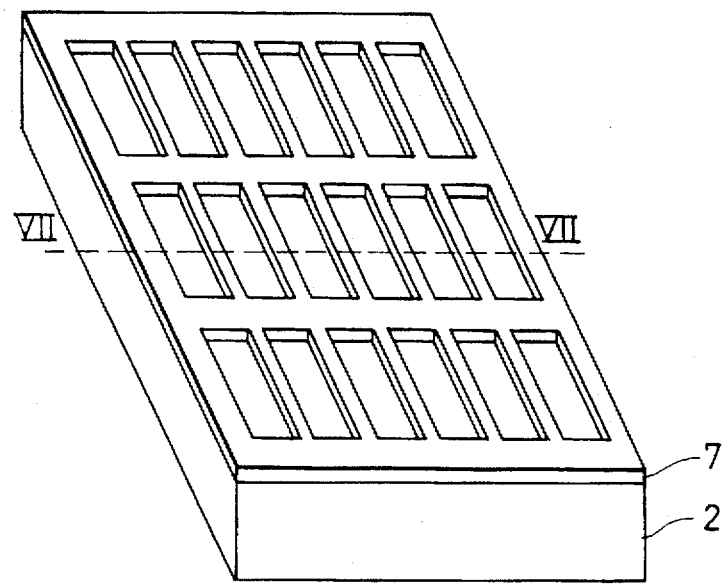
FIG. 9 is a perspective view of the substrate carrying the ramparts surrounding the electrodes of the embodiment of the organic EL display panel according to the present invention.

FIG. 9 shows a perspective view of the resulting substrate carrying the ramparts surrounding the first display electrodes of the organic EL display panel. Alternatively, each rampart may be formed so as to surround one pixel consisting of three or more first display electrodes. The width of the rampart 7 is approximately 0.02 mm. The recess area of the rampart is approximately 0.3 mm×0.1 mm. This size of pixel suffices for 640×480 pixels of a 10 inch full color display device. Since the rampart partitions the organic function layers in the later process of plural iterations of film-formation using the shadow mask, the height of the rampart is set approximately 0.5 micrometers or more in order to prevent the shadow mask from damaging the top thereof and the stacked organic function layer 8. Since too high a rampart tend to break, it is preferable to be set in height 10 micrometers or less preferably, 1 to 2 micrometers. In addition, the rampart is preferably formed so as to have a trapezoid cross-section in order to prevent the rampart from breaking the second display electrode as a cathode formed in the later process. Alternatively, the matrix rampart may be formed on the substrate by using a screen-printing method with a glass paste containing light absorbing materials being selectively coated. In the embodiment the rampart is formed so as to define a rectangle emitting portion, but other shape such as square, circular or the like may be formed by the rampart bottom profile.

Figure 10:
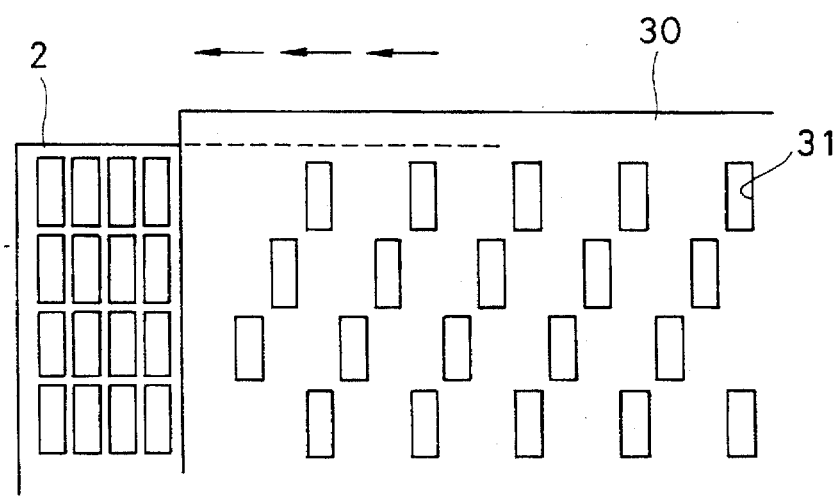
FIG. 10 is a partially enlarged plan view of a shadow mask used in the method for manufacturing an organic EL display panel according to the present invention.

FIG. 10 shows a partially enlarged plan view of a shadow mask used in the vacuum-depositions of EL media. This shadow mask 30 has openings 31 arranged in a stepwise form. The shadow mask 30 is moved forward as indicated by arrows FIG. 10 over the rampart 7 of the substrate 2 after every vacuum-deposition of EL medium, so that the three vacuum-depositions of R medium, G medium and B medium are performed at least three times by using the shadow mask.

FIGS. 11A to 11D show steps of forming emitting layers within the ramparts and a step of forming the second display electrode. In this figure, only one set of RGB emitting layers are shown for one pixel, but in practice a plurality of pixels are formed simultaneously in a coplanar plan of the substrate.

Figure 11A:
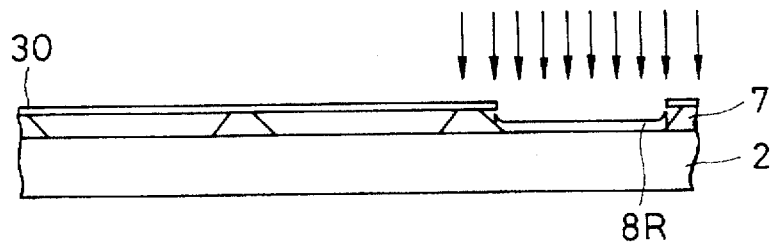
FIGS. 11A to 11D are cross-section views showing substrates each carrying nonlinear elements and ramparts surrounding them in the processes for manufacturing an organic EL display panel according to the present invention.

In the step of FIG. 11A, each opening 31 of the shadow mask 30 is aligned to a portion of the substrate 2 surrounded by the rampart 7 and the shadow mask is put and fixed onto top surfaces of the ramparts. After that, a first organic function layer 8R for a first color emission (e.g., red) is vacuum-deposited at a thickness of 0.1 to 0.2 micrometers through the openings onto the first display electrodes in the ramparts. The shadow mask 30 has an area size covering the substrate except for the openings 31 to expose the first display electrodes at bottoms surrounded by the ramparts. In this way, the first color organic function layers are formed on the first display electrodes respectively. In addition, in case that the organic function layer of the three-layer structure (e.g., an organic hole transport layer, an organic emitting layer and an organic electron transport layer) is formed, the corresponding different organic media may be vacuum-deposited in this step. For each later step for forming the function layer, this multi deposition may be performed similarly.

Figure 11B:
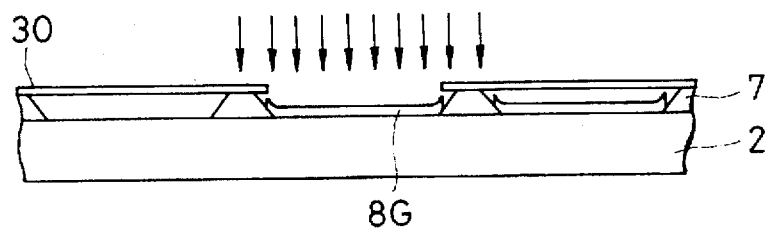

In the step of FIG. 11B, the shadow mask is shifted toward the left by one rampart so that the opening is aligned to the adjacent rampart, and then the mask is fixed onto top surfaces of the ramparts. After that, a second organic function layer 8G for a second color emission (e.g., green) is vacuum-deposited at the predetermined thickness.

Figure 11C:
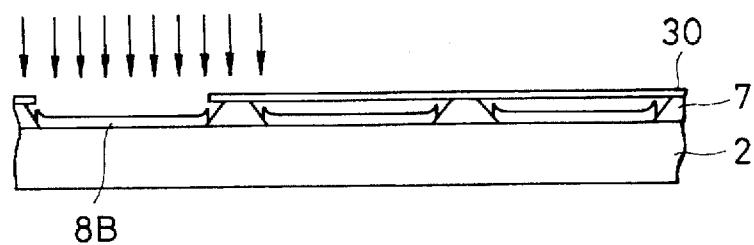

In the step of FIG. 11C, the shadow mask is similarly shifted toward the left by one rampart so that the opening is aligned to the adjacent rampart, and then the mask is fixed onto top surfaces of the ramparts. After that, a third organic function layer 8B for a third color emission (e.g., blue) is vacuum-deposited at the predetermined thickness.

In this way, it is preferable that the mask putting and aligning step and the media depositing step are repeated in such a manner that the shadow mask is shifted to an adjacent portion whereby the openings are aligned to adjacent other first display electrodes, since the manufacturing of the panel is improved. The rampart 7 is useful to prevent the shadow mask from damaging the organic function layer when the aligning, shifting and putting of the mask are performed in the vacuum-depositions of the organic function layers.

Figure 11D:
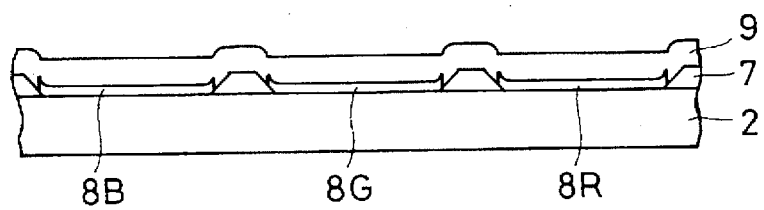

FIG. 11D shows a step for forming the second display electrode in which, after the shadow mask for the media is removed, a low resistance metal such as Al, Mg, Au and the like and an alloy thereof is vacuum-deposited or sputtered as a cathode with a thickness of 0.1 to 10 micrometers all over on the organic function layers so as to electrically connect them to each other by the cathode. This metal cathode may be 10 micrometers or more as far as it does not provide any obstacles.

According to the present invention, the film formation of the organic function layer using the rampart and the shadow mask put thereto realizes an available separation of the organic function layers, so that a colorful fine full color display panel comprising organic function layers is manufactured without deterioration of the organic function layer nor any leakage of EL medium to adjacent pixels.

It should be noted that the size of the individual opening of the shadow mask is defined so as to prevent the short-circuit between ITO and/or TFT formed on the substrate and the cathode and so as to avoid the deposition of the organic function layer into an adjacent electrode area surrounded by the rampart. There is no problem if the organic function layer is deposited onto the top surface of the rampart.

Figure 12A:
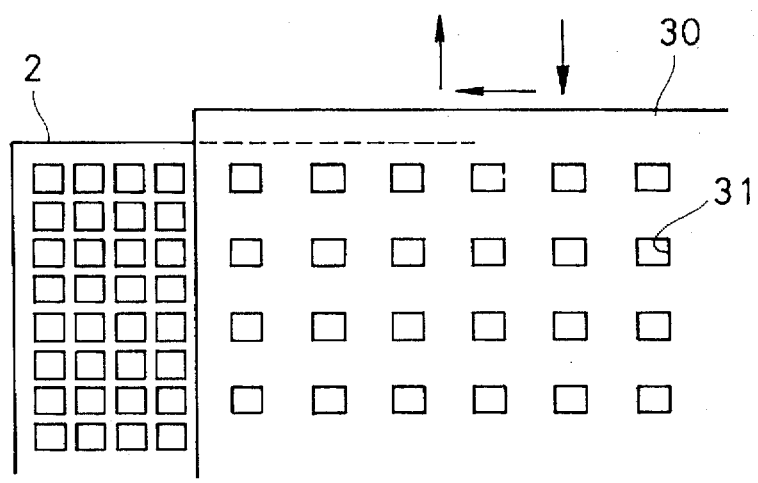
FIGS. 12A and 12B are partially enlarged plan views of another shadow mask used in the method for manufacturing an organic EL display panel according to the present invention and the resulting substrate carrying the ramparts surrounding the electrodes respectively.
Figure 12B:
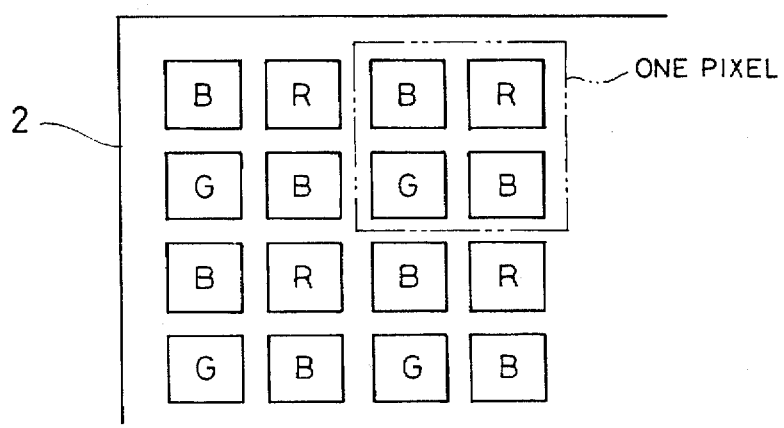

In a variation for these steps of forming the organic function layers, instead of the shadow mask 30 with stepwise arrangement openings shown in FIG. 10, a shadow mask 30 with matrix-arrangement openings 31 shown in FIG. 12A is usable. In this case, this mask 30 is moved in turn as indicated by arrows of FIG. 12A over the rampart of the substrate, so that the organic function layers of R, G and B are vacuum-deposited in the quadrangle form. As shown in FIG. 12B, each pixel becomes a square area including four emitting portions. Although the B medium inherently has a low luminance, this embodiment achieves two emitting portions B per one pixel. The shadow mask 30 with matrix-arrangement openings 31 is stronger than the shadow mask with stepwise arrangement openings. The number of vacuum-deposition steps is at least four times.

In another embodiment, an organic EL display panel of a simple matrix type comprises the intersecting first and second display electrodes of stripe lines sandwiching the organic function layers at each intersection.

Figure 13:
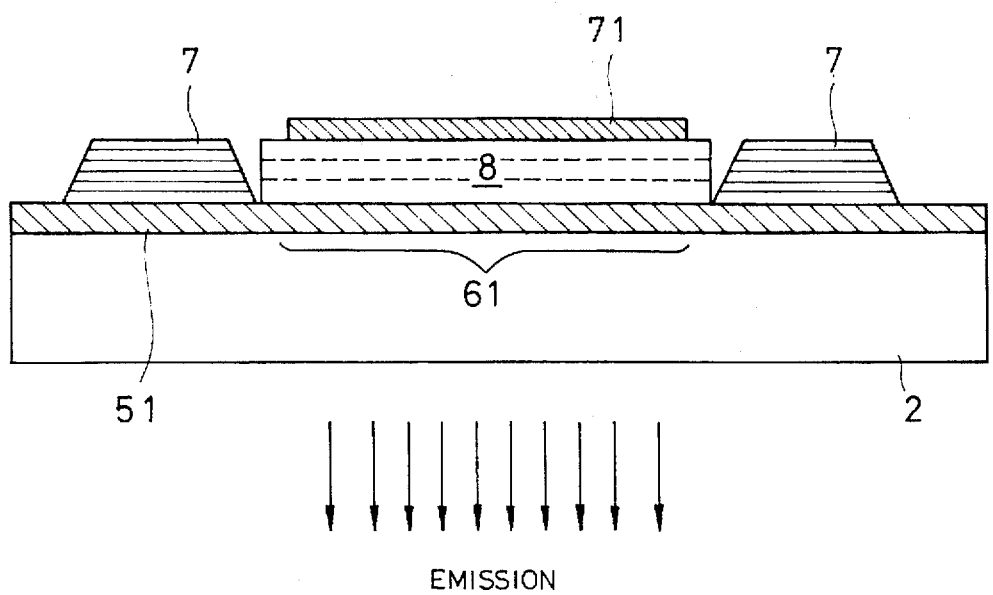
FIG. 13 is a partially enlarged cross-sectional view of the substrate carrying ramparts partly surrounding first electrodes of another embodiment of the organic EL display panel according to the present invention.

As shown in FIG. 13, the simple matrix type organic EL display panel comprises the first display electrode lines 51 formed on the substrate 2, the lines 51 being electrically separated parallel to each other. The substrate 2 carries portions 61 to become a plurality of first display electrodes corresponding to emitting portions R, G and B respectively. To define such portions 61, electrical insulation ramparts 7 are formed on the substrate 2 so as to surround those portions 61 and project from the substrate 2. The organic function layers 8 are formed on the portions 61 respectively as each being the three-layer structure (e.g., an organic hole transport layer, an organic emitting layer and an organic electron transport layer), and alternatively the two-layer structure (an organic hole transport layer and an organic emitting layer). The second display electrode lines 71 are formed on the organic function layers 8 so as to be perpendicular to the first display electrode lines 51. A protective film or substrate with insulation may be formed preferably on the second display electrode lines 51.

Figure 14A:
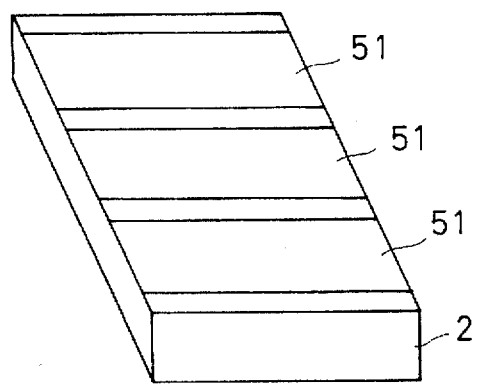
FIGS. 14A to 14C are perspective views of the substrates in the processes for manufacturing an organic EL display panel of another embodiment according to the present invention.
Figure 14B:
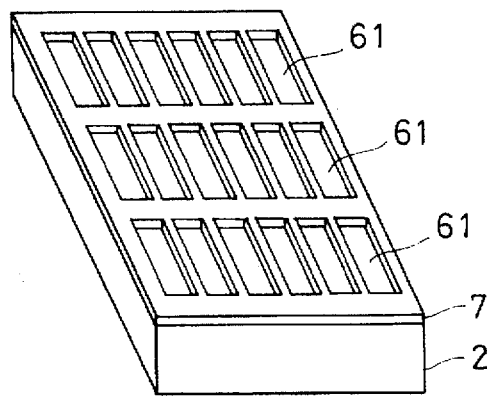

FIG. 14 shows a process for manufacturing such simple matrix type organic EL display panel. A plurality of parallel first display electrode lines 51 of ITO are deposited as stripes on the glass substrate 2 (FIG. 14A). Next, the ramparts 7 of a photoresist or photosensitive polyimides are also selectively formed on the first display electrode lines of the substrate 2 up to a predetermined height by using the photolithography, so that the first display electrode portions 61 are defined and surrounded as shown in FIG. 14B.

Next, by using the above steps in the same manner as shown in FIG. 11A to 11C, the RGB organic function layers including RGB emitting layers are vacuum-deposited on the first display electrode portions 61 while shifting the shadow mask.

Figure 14C:
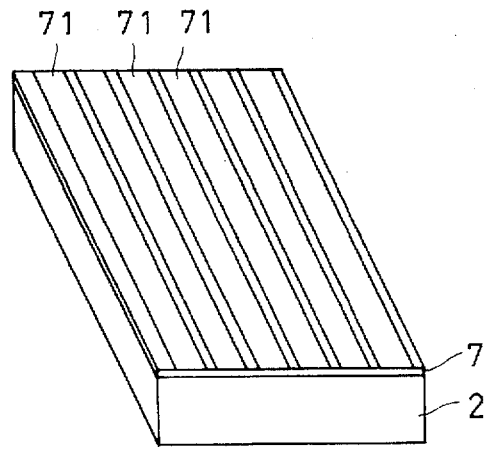

Last, as shown in FIG. 14C, the parallel stripe second display electrode lines 71 of low resistance metal are vacuum-deposited or sputtered with a shadow mask with parallel slits on the ramparts 7 and the organic function layers so that the second display electrode lines 71 extend perpendicular to the first display electrode lines 51.

According to the present invention, the following advantageous effects are obtained.

(1) After the formation of the organic EL layers, it is unnecessary to perform a step that has a probability of damaging the organic function layer such as the photolithography.

(2) The cathode may be preferably formed on the surface of the ramparts and the organic function layers as a whole to be uniform.

(3) The number of the steps in the manufacturing is reduced from those of the prior art, the separation of the RGB organic function layers is reliably achieved so that the RGB media are shared with a high precision.

(4) Due to the rampart, the protection of the organic function layer is stable and the damage of the layers is reduced.

(5) Since a shadow mask with matrix-arrangement openings for RGB media may be used, the warp of the shadow mask is avoided due to its rigidity, then the use of such a mask prevents from damaging the organic function layer and the rampart in the shifting and aligning of the mask.

It should thus be apparent that the scope of the teaching of this invention is not intended to be limited by only the embodiments that have been expressly disclosed and illustrated, but that instead the scope of the teaching of this invention should be read as being commensurate with the scope of the claims that follow.

What is claimed is:

1. An organic electroluminescent display panel having a plurality of emitting portions arranged as a matrix comprising:

a substrate on which a plurality of first display electrodes corresponding to emitting portions are formed;

electrical insulation ramparts formed on said substrate so as to project higher than a level of said first display electrodes from said substrate between said first display electrodes;

organic function layers each including at least one organic electroluminescent medium formed on said first display electrodes between said ramparts; and at least one second display electrode formed on said ramparts and said organic function layers.

2. An organic electroluminescent display panel as set forth in claim 1 and further comprising:

common scan signal lines and common data signal lines which are formed on said substrate in a coplanar surface thereof and arranged perpendicularly to one another; and nonlinear elements each connected to said scan signal line, said data signal line and one of said first display electrodes.

3. An organic electroluminescent display panel as set forth in claim 2, wherein each of said nonlinear elements comprises a thin film transistor and a capacitor connected to each other.

4. An organic electroluminescent display panel as set forth in claim 1, wherein said substrate and said first display electrodes are transparent.

5. An organic electroluminescent display panel as set forth in claim 4, further comprising a reflection film formed on an outer side surface of said second display electrodes.

6. An organic electroluminescent display panel as set forth in claim 1, wherein said second display electrode is transparent.

7. An organic electroluminescent display panel as set forth in claim 6, further comprising a reflection film formed on an outer side surface of said first display electrodes.

8. An organic electroluminescent display panel as set forth in claim 1, wherein said second display electrode is formed all over on said ramparts and said organic function layers.

9. An organic electroluminescent display panel as set forth in claim 1, wherein said second display electrode is formed in stripe on said ramparts and said organic function layers.

10. A method for manufacturing an organic electroluminescent display panel having a plurality of emitting portions arranged as a matrix, comprising the steps of;

forming a plurality of first display electrodes corresponding to emitting portions on a substrate;

forming, on said substrate around said first display electrodes, electrical insulation ramparts so as to project higher than a level of said first display electrodes from said substrate between said first display electrodes;

putting a shadow mask onto top surfaces of said ramparts, the shadow mask having a plurality of openings each exposing one of said first display electrodes between said ramparts, and aligning the openings to said first display electrodes respectively;

depositing organic electroluminescent media through said openings onto said first display electrodes between said ramparts respectively, thereby forming organic function layers each including at least one organic electroluminescent medium on said first display electrodes between said ramparts; and forming at least one second display electrode on said ramparts and said organic function layers.

11. A method as set forth in claim 10 further comprising, before or during the first display electrode forming step, a step of forming common scan signal lines and common data signal lines which are formed on said substrate in a coplanar surface thereof and arranged perpendicularly to one another and nonlinear elements each connected to said scan signal line, said data signal line and one of said first display electrodes.

12. A method as set forth in claim 11, wherein each of said nonlinear elements comprises a thin film transistor and a capacitor connected to each other.

13. A method as set forth in claim 10, wherein the mask putting and aligning step and the media depositing step are repeated in such a manner that said shadow mask is shifted to an adjacent portion where the openings aligned to adjacent other first display electrodes.

14. A method as set forth in claim 10, wherein said second display electrode is formed all over on said ramparts and said organic function layers.

15. A method as set forth in claim 10, wherein said second display electrode is formed in stripe on said ramparts and said organic function layers.

* * * * *